United States Patent
Shinno et al.

(10) Patent No.: US 11,820,048 B2
(45) Date of Patent: Nov. 21, 2023

(54) MOLD AND PRODUCTION METHOD THEREFOR

(71) Applicant: Proterial, Ltd., Tokyo (JP)

(72) Inventors: Daiki Shinno, Tokyo (JP); Shuho Koseki, Tokyo (JP)

(73) Assignee: Proterial, Ltd., Tokyo (JP)

( * ) Notice: Subject to any disclaimer, the term of this patent is extended or adjusted under 35 U.S.C. 154(b) by 1111 days.

(21) Appl. No.: 16/464,301

(22) PCT Filed: Nov. 27, 2017

(86) PCT No.: PCT/JP2017/042393
§ 371 (c)(1),
(2) Date: May 28, 2019

(87) PCT Pub. No.: WO2018/097286
PCT Pub. Date: May 31, 2018

(65) Prior Publication Data
US 2021/0107183 A1   Apr. 15, 2021

(30) Foreign Application Priority Data
Nov. 28, 2016 (JP) .................................. 2016-229852

(51) Int. Cl.
*B29C 33/38* (2006.01)
*B22D 17/22* (2006.01)
*C23F 17/00* (2006.01)

(52) U.S. Cl.
CPC ...... *B29C 33/3842* (2013.01); *B22D 17/2209* (2013.01); *C23F 17/00* (2013.01)

(58) Field of Classification Search
CPC .................................................. B29C 33/3842
See application file for complete search history.

(56) References Cited

U.S. PATENT DOCUMENTS 5,246,198 A * 9/1993 Kurihara ............... C23C 16/278
249/115
5,380,349 A * 1/1995 Taniguchi ............. C03B 11/084
65/374.13

(Continued)

FOREIGN PATENT DOCUMENTS

JP   H02188432   7/1990
JP   H0711375    1/1995

(Continued)

OTHER PUBLICATIONS

"Office Action of China Counterpart Application" with English translation thereof, dated Nov. 1, 2021, p. 1-p. 18.

(Continued)

*Primary Examiner* — Christopher S Kessler
(74) *Attorney, Agent, or Firm* — JCIPRNET (57) ABSTRACT

The purpose of the present invention is to provide a mold having both good adhesion resistance and smoothness, and a production method therefor. Provided is a mold made of a composite material comprising hard phases and metal phases characterized in that the mold has a reinforced layer made of hard phases for a working surface and the working surface satisfies the arithmetic average roughness Ra≤0.1 μm and skewness Rsk≤−0.01. Also provided is a production method for a mold made of a composite material comprising hard phases and metal phases characterized in having: a shaping step for working the surface of the mold made of said composite material and adjusting to Ra≤0.1 μm; and after the shaping step, a surface layer-modifying step for etching the surface of the mold adjusted to Ra≤0.1 μm and removing the metal phases near the surface.

9 Claims, 9 Drawing Sheets

(56) References Cited

U.S. PATENT DOCUMENTS

| | | | |
|---|---|---|---|
| 7,906,030 B2 * | 3/2011 | Nakagawa | C04B 41/5346 216/11 |
| 2012/0131980 A1 * | 5/2012 | Yamamoto | B21J 3/00 72/352 |

FOREIGN PATENT DOCUMENTS

| | | |
|---|---|---|
| JP | 40892741 | 4/1996 |
| JP | H08216160 | 8/1996 |
| JP | 2005041107 | 2/2005 |
| JP | 2008307687 | 12/2008 |
| JP | 2010018861 | 1/2010 |
| JP | 2010024518 | 2/2010 |
| JP | 2012115869 | 6/2012 |
| WO | 2016171273 | 10/2016 |

OTHER PUBLICATIONS

"Office Action of China Counterpart Application", dated Jun. 4, 2021, with English translation thereof, p. 1-p. 13.
"Written Opinion of the International Searching Authority (Form PCT/ISA/237) of PCT/JP2017/042393," dated Dec. 26, 2017, with English translation thereof, pp. 1-11.
"Office Action of Malaysia Counterpart Application," dated Feb. 9, 2022, p. 1-p. 3.
"Office Action of China Counterpart Application", dated Sep. 3, 2020, with English translation, p. 1-p. 17.
Office Action of Korea Counterpart Application, with English translation thereof, dated Nov. 27, 2020, pp. 1-12.
"Office Action of Korea Counterpart Application", dated May 27, 2020, with English translation thereof, p. 1-p. 13.
"International Search Report (Form PCT/ISA/210) of PCT/JP2017/042393," dated Dec. 26, 2017, with English translation thereof, pp. 1-4.

* cited by examiner

MOLD AND PRODUCTION METHOD THEREFOR

CROSS-REFERENCE TO RELATED APPLICATION

This application is a 371 application of International PCT application serial no. PCT/JP2017/042393, filed on Nov. 27, 2017, which claims the priority benefit of Japan application no. 2016-229852, filed on Nov. 28, 2016. The entirety of each of the above-mentioned patent applications is hereby incorporated by reference herein and made a part of this specification.

TECHNICAL FIELD

The present invention relates to a mold and a production method therefor.

BACKGROUND ART

Composite alloys comprising hard phases represented by ceramics and the like and metal phases represented by Ni, Co, Fe, and the like are used for jigs and tools due to their excellent impact resistance at room and high temperatures. In order to improve mechanical characteristics of jigs and tools in which such composite alloys are used, various research has been conducted. For example, Patent Literature 1 discloses a cemented carbide characterized in that it is mainly composed of WC to improve abrasion resistance and hardness, only WC particles or only components other than iron-group metals and WC particles are substantially exposed on the surface layer, the average particle diameter of WC particles on the surface layer is larger than the average particle diameter of WC particles of the inside, and/or the surface hardness is greater than the hardness of the inside.

In addition, Patent Literature 2 discloses a coated cemented carbide in which ceramic particles of metal carbides of Group IVa, Group Va, and Group VIa of the Periodic Table of Elements, silicon carbides, alumina or the like are embedded in a surface of cemented carbide for coating it with a diamond film having excellent abrasion resistance with good adhesion, then unevenness is formed by performing an electrolytic etching process, and then the diamond film is coated thereon after the formation of the unevenness.

CITATION LIST

Patent Literature

[Patent Literature 1]
Japanese Unexamined Patent Application Publication No. H07-11375
[Patent Literature 2]
Japanese Unexamined Patent Application Publication No. H08-92741

SUMMARY OF INVENTION

Technical Problem

With respect to a jig or tool, particularly, a mold, when a workpiece is made of a metal material, abrasion occurs due to adhesion resulting from contact of metals when a working surface of the mold slides on the workpiece, and thus damage to the mold is problematic. Thus, there is demand for molds to have improved adhesion resistance while maintaining smoothness of the working surfaces of the mold to prevent abrasion powder from being generated due to impact of the mold on workpieces attributable to a greater requirement for precision or use in severe environments. Although the invention of Patent Literature 1 described above is excellent in increasing the hardness of the surface of cemented carbide with respect to such a demand, no improvement in adhesion resistance is described, which leaves room for further research. In addition, the invention of Patent Literature 2 is an invention in which unevenness is formed on the surface to improve adhesion of the diamond film, and desired adhesion resistance is particularly not likely to be obtained in precise molds. An objective of the present invention is to provide a mold having both good adhesion resistance and smoothness and a production method therefor.

Solution to Problem

The present invention has been conceived in consideration of the above-described problems.

That is, the present invention is a mold made of a composite material comprising a hard phase and a metal phase, wherein the mold has a reinforced layer composed of a hard phase on a working surface, in which the working surface satisfies an arithmetic average roughness of Ra≤0.1 μm and skewness Rsk≤−0.01.

Preferably, the surface of the mold may satisfy skewness Rsk≤−1.0.

Preferably, the hard phase may be WC, and the metal phase may be Co.

In addition, the present invention is a mold made of a composite material comprising a hard phase and a metal phase, wherein the mold has a reinforced layer composed of a hard phase on a working surface, in which a hard film is provided on a top surface of the reinforced layer, the hard film is one or more kinds selected from at least one kind of carbide, nitride, carbonitride, oxide and boride of Groups 4, 5, and 6 transition metals, Si, and Al, and diamond-like carbon, and a surface of the hard film satisfies an arithmetic average roughness of Ra≤0.1 μm and skewness Rsk≤−1.0.

In addition, another aspect of the present invention is a production method for a mold made of a composite material comprising a hard phase and a metal phase, and the method includes a shaping step for working a surface of the mold made of the composite material and adjusting to Ra≤0.1 μm, and a surface layer-modifying step after the shaping step for etching the surface of the mold adjusted to Ra≤0.1 μm and removing the metal phase near the surface through etching.

Preferably, the surface layer-modifying step may be wet etching using an acidic solution.

Preferably, the production method may include a coating step of coating the surface of the mold with a film selected from one or more kinds of at least one kind of carbide, nitride, carbonitride, oxide and boride of Groups 4, 5, and 6 transition metals, Si, and Al, and diamond-like carbon after the surface layer-modifying step.

Advantageous Effects of Invention

According to the present invention, a mold having both good adhesion resistance and smoothness can be obtained.

BRIEF DESCRIPTION OF DRAWINGS

FIG. 1(a) to FIG. 1(c) show optical micrographs showing the result of the sliding test of an example of the present invention.

FIG. 2(a) to FIG. 2(c) show optical micrographs showing the result of the sliding test of a comparative example.

FIG. 3(a) and FIG. 3(b) are observation photos taken after the sliding test in which the sliding part of the example of the present invention is further enlarged. FIG. 3(a) is an enlarged photo of FIG. 1(b), and FIG. 3(b) is an enlarged photo of FIG. 1(c).

FIG. 4(a) and FIG. 4(b) are observation photos taken after the sliding test in which the sliding part of the comparative example is further enlarged. FIG. 4(a) is an enlarged photo of FIG. 2(b), and FIG. 4(b) is an enlarged photo of FIG. 2(c).

FIG. 6(a) and FIG. 6(b) shows schematic side views of the sliding test device used in Examples.

DESCRIPTION OF EMBODIMENTS

The present invention will be described below in detail. However, the present invention is not limited to the embodiments exemplified herein, and these can be appropriately combined and modified within a scope not departing from the technical gist of the invention.

A mold of the present invention is a mold made of a composite material in which two phases that are a hard phase and a metal phase serving as a binder (binder phase) are mixed. This mold has both the advantages of the hard phase (excellent strength) and the metal phase (high ductility and toughness).

The hard phase of the mold of the present invention is preferably selected from at least one kind of carbide, nitride, carbonitride, oxide, and boride of W (tungsten), Cr (chromium), Mo (molybdenum), V (vanadium), Zr (zirconium), Al (aluminum), Si (silicon), Nb (niobium), Ta (tantalum), and Ti (titanium).

In addition, the metal phase of the mold of the present invention is preferably selected from at least one kind of Co (cobalt), Ni (nickel), Fe (iron), W (tungsten), and Mo (molybdenum).

Further, although not specifically described, the mold of the present embodiment may be formed of a WC—Co composite material in which tungsten carbide (WC) is selected for the hard phase and Co is selected for the metal phase.

The mold of the present invention has a reinforced layer made of the hard phase for a working surface (a surface of the mold that comes in contact with a workpiece). The reinforced layer made of the hard phase is a layer in which substantially no metal phase exists. According to an embodiment of a production method which will be described below, the reinforced layer can be manufactured by removing the metal phase from the surface of the mold made of the hard phase and the metal phase. Since there can be a part that will not be completely removed in the removal of the metal phase, it is assumed that substantially no metal phase exists. In comparison to the part that is not the reinforced layer, that is, the main part (the part other than the surface) of the mold made of the hard phase and the metal phase, the abundance of the metal phase in the reinforced layer is distinctly different, and thus it is easy to identify the reinforced layer in which substantially no metal phase exists.

In addition, the reinforced layer is preferably a layer made of the hard phase and voids, or the hard phase and a material other than the metal phase filling the voids. The voids may be formed by removing the metal phase, may be voids as they are, or may be filled with a material other than the metal phase. Of course, some voids may remain.

In addition, in an area ratio according to observation of a cross-section, if the ratio of the area of the hard phase to the sum of the areas of the hard phase and the metal phase is assumed to be a hard phase ratio, the hard phase ratio of the main part of the mold of the present invention is higher than the hard phase ratio of the reinforced layer, and the hard phase ratio of the reinforced layer is preferably 99% or higher. An example of a method for measuring the hard phase ratio will be described below. First, a mold is cut in a direction orthogonal to a working surface, and a photo is taken using a scanning electron microscope (SEM) at a predetermined magnification (a magnification of 10,000 times in the present embodiment) such that the working surface part of the mold comes into the visual field. The substantially flat top surface of the hard phase forming the working surface is connected with a straight line A, and a straight line B obtained by moving the straight line A parallel to the depth direction of the mold is drawn at a position at least 0.2 μm from the surface of the mold in the depth direction. Then, the area ratio of the hard phase when the area ratio of the hard phase and the metal phase in the rectangular area surrounded by the straight line A, the straight line B, and the photo ends is assumed to be 100% is set as a hard phase ratio. Further, since the surface of the hard phase forming the working surface is substantially flat in the mold of the present invention, the above-described straight lines can be created. Here, "substantially flat" mentioned in the present specification indicates a shape mainly having a flat shape to the extent that a straight line can be created on the top surface of the hard phase including fine unevenness existing on the top surface of the hard phase serving as a working surface or a curved surface having a very large radius of curvature. Further, when the working surface has curvature, a curved line may be used according to the curvature, and with respect to the depth direction, a curved line at least 0.2 μm away from the curved line of the surface in the depth direction may be used.

By forming the reinforced layer, the metal phase that is soft and easily adheres to a workpiece will not be present on the working surface of the mold, and thus it is expected that adhesion resistance will be dramatically improved and the life of the mold will be significantly prolonged. In addition, it is also important in the present invention with respect to surface roughness of the working surface that arithmetic average roughness Ra (based on JIS-B-0601-2001) be 0.1 µm or smaller and a skewness Rsk be −0.01 or smaller. Accordingly, in the mold of the present invention, roughness curves on the surface of the working surface have a wider range of protrusions than recesses, the formation of sharp protrusions can be curbed, and thus wear and tear starting from protrusions of the working surface can be dramatically suppressed, and excellent sliding characteristics can be exhibited. In addition, although when the working surface of the mold and the workpiece are smooth, it is difficult for the contact part of the working surface to become impregnated with a lubricating oil, by forming moderate recesses (which will also be described as voids) on the working surface of the mold at Rsk set to −0.01 or smaller in the present invention, the characteristics of impregnation with a lubricating oil can be improved, and excellent sliding characteristics can be exhibited. In addition, although, when the working surface of the mold and the workpiece are smooth, vacuum adhesion is likely to occur, the contact surface of the mold and the workpiece can be prevented from being brought into a vacuum state due to the above-described recesses, and thus excellent sliding characteristics can be obtained due to this effect. In order to obtain the effect more reliably, Rsk of the present invention is preferably −1.0 or smaller. Further, the present invention exhibits the effect particularly when the workpiece is formed of a metal material.

The reinforced layer of the present invention is preferably formed at least in the range of 0.2 µm in the depth direction from the surface of the working surface. Accordingly, the above-described adhesion resistance can be further improved. The reinforced layer is preferably formed at least in a range of 0.5 µm in the depth direction from the surface of the working surface and more preferably formed in a range of 1 µm. Here, when a hard film (which may also be referred to simply as a "film" below) is formed on the reinforced layer as will be described below, the reinforced layer is measured from the interface of the coating layer and the reinforced layer. In addition, in order to make it easier to form voids to be formed in the reinforced layer, the mold of the present invention has the hard phase preferably having a diameter of 1 µm or larger. Although the upper limit of the diameter of the hard phase is not particularly limited, it may be about 15 µm for stably maintaining the strength of the mold. Further, according to the production method of the present invention which will be described below, the reinforced layer is substantially uniformly formed on the entire working surface through etching, and thus for example, the range of a cross-section of the working surface in the range of about 10 µm to 20 µm in the in-plane direction may be checked using a measurement device such as a scanning electron microscope (SEM). In addition, for the diameter of the hard phase, a circle-equivalent diameter may be obtained using microtomy (an intercept method) from a cross-section photo.

The working surface of the mold of the present invention can also have a configuration in which the reinforced layer is coated with a diamond-like carbon film (which will also be referred to as a DLC film below) as a hard film. Accordingly, abrasion resistance of the mold can be improved, and unevenness is also formed on the surface of the DLC film to conform to the unevenness on the surface of the reinforced layer, and thus the advantage of providing the above-described voids can also be expected to be exhibited. For the purpose of improving hardness and adhesion to the mold, the content of hydrogen atoms on the surface of the DLC film can be set to 0.5 atom % or smaller, and the content of nitrogen can be set to 2 atom % or smaller. In addition, when the content of hydrogen on the side of the DLC film interfacing with the reinforced layer is set to 0.7 atom % or greater and 7 atom % or smaller, and the content of nitrogen thereof is set to greater than 2 atom % and 10 atom % or smaller, further improvement in abrasion resistance can be expected.

In order to impart abrasion resistance, heat resistance, or the like, the DLC film may include a metal (including a semi-metal) element, and may include it in a form of a metal or an alloy or a compound form such as carbide, nitride, carbonitride, oxide, or carbo-boride. The content (atom %) of a metal (including a semi-metal) element in the DLC film is preferably set to 2% or higher, and more preferably to 5% or higher. However, as the content of a metal (including a semi-metal) element increases, there is a trend of deterioration in sliding characteristics. Thus, the content (atom %) of a metal (including a semi-metal) element in the DLC film can be set to 20% or lower and more preferably 10% or lower. Further, a thickness of the DLC film can be set to 0.1 µm to 1.5 µm, or may be set to 0.1 µm to 1.2 µm in order to further improve durability or adhesion to the mold, and a thickness of the DLC film may be set to 0.2 µm or thicker in order to impart sufficient abrasion resistance to the mold. A thickness of the DLC film may be set to 0.5 µm to 1.2 µm in order to achieve smooth surface roughness and good abrasion resistance at the same time.

To further improve abrasion resistance, it is preferable for the mold of the present invention to have a hard film of one or more kinds selected from at least one kind of carbide, nitride, carbonitride, oxide and boride of Groups 4, 5, and 6 transition metals, Si, and Al formed on the reinforced layer. More preferably, a film made of Cr-based nitride, Ti-based nitride, or Ti-based carbonitride can be applied, and even more preferably, a film made of TiCN, AlCrN, TiSiN, TiAlN, AlCrSiN, TiAlSiN, or TiAlCrSiN can be applied. Most preferably, a film made of AlCrSiN is applied. In addition, when AlCrSiN is applied in order to stably improve abrasion resistance, it is preferable to control a composition formula of $Al_xCr_ySi_z$ such that $20<x<75$, $25<y<75$ and $0<z<10$ are satisfied. Likewise, when TiAlSiN is applied, it is preferable to control a composition formula of $Ti_xAl_ySi_z$ such that $25<x<75$, $20<y<75$ and $0<z<10$ are satisfied. A preferable thickness of the film is 0.1 µm to 5.0 µm, the lower limit of a more preferable thickness is 0.5 µm, and the upper limit thereof is 2.0 µm. The reason for this is that, if the thickness is too thick, protrusions of the hard phase may be difficult to trace and advantageous effects such as the above-described adhesion resistance may not be exhibited, and if the thickness is too thin, the effect of sufficiently improved abrasion resistance may not be obtained. Here, when an $Al_xCr_ySi_zN$ film is used, a graduated composition in which the x value increases and the y value decreases may be obtained from the base material side to the film surface side. Accordingly, adhesion strength with respect to the base material can be further improved. Further, since the hard phase is sporadically formed on the film surface layer and the hard film is continuously formed to cover the hard phase, it is possible to distinguish the hard phase from the hard film when a cross-section of the mold is observed.

It is preferable for the mold of the present invention having the film to have surface roughness of the film surface be made of an arithmetic average roughness Ra of 0.1 µm or smaller and have Rsk of −1.0 or smaller. More preferably, Ra is 0.06 μm or smaller. Accordingly, without impairing the effect of adhesion resistance of the reinforced layer, it is possible to prevent the unevenness on the film surface from serving as a starting point of abrasion, and to further improve abrasion resistance. In addition, it is preferable to adjust a maximum height Rz of the film surface to 1.0 μm or lower to prevent the formation of excessive protrusions and to improve abrasion resistance.

Next, the production method for a mold of the present invention will be described.

The production method of the present invention includes a shaping step for working the surface of the mold made of a composite material comprising the hard phase and the metal phase and adjusting the surface to Ra≤0.1 μm, and a surface layer-modifying step after the shaping step for etching the surface of the mold adjusted to Ra≤0.1 μm and removing the metal phase near the surface. The mold made of the composite material can be manufactured using a known method, and can be obtained by, for example, pressing and molding a mixed powder of a hard powder and a metal powder into a predetermined shape, and then sintering the mold at a temperature of 1250 to 1550° C. under vacuum. Further, in order to further improve the strength of the mold, it is preferable for the mixed powder used in the production method of the present invention to have a volume ratio between the hard powder and the metal powder of 97:3 to 70:30. In addition, the hard powder is preferably selected from at least one kind of carbide, nitride, carbonitride, oxide, and boride of W (tungsten), Cr (chromium), Mo (molybdenum), V (vanadium), Zr (zirconium), Al (aluminum), Si (silicon), Nb (niobium), Ta (tantalum), and Ti (titanium), and the metal powder is preferably selected from at least one kind of Co (cobalt), Ni (nickel), Fe (iron), W (tungsten), and Mo (molybdenum).

<Shaping Step>

The shaping step for adjusting the surface of the mold prepared using the production method of the present invention to Ra≤0.1 μm is performed through grinding, polishing, cutting, and electric discharge machining. The surface of the mold, particularly, the surface of the mold serving as a working surface, becomes smooth due to the shaping step, then smooth and moderate recesses are formed by performing the surface layer-modifying step, and thereby a working surface satisfying surface roughness of Ra≤0.1 μm and skewness Rsk≤−0.01 can be formed. More preferably, the upper limit of Ra is preferably 0.05 μm, and more preferably 0.02 μm. Although the lower limit thereof is not particularly defined, it can be set to, for example, 0.001 μm considering mass production. Here, the shaping step may be constituted by a combination of multiple steps, and the surface may be adjusted to Ra≤0.1 μm in the finishing process using polishing after, for example, it is roughened through grinding. Although a known grinding method can be used in the polishing of that time, buffing may be performed using a diamond paste to reliably obtain desired surface roughness.

<Surface Layer-Modifying Step>

Next, after the shaping step in the production method of the present invention, the surface layer-modifying step for etching the surface of the mold adjusted to have Ra≤0.1 μm and removing the metal phase near the surface is performed, and thereby the mold of the present invention is obtained. Accordingly, the reinforced layer made of the hard phase can be formed on the working surface of the mold. In the present invention, etching is applied in the surface layer-modifying step, and wet etching performed using an acidic solution or an alkaline solution or dry etching performed using a discharge plasma can be used. More specifically, wet etching in which the reinforced layer made of the hard phase can be easily formed to be thick and Rsk can be easily and stably adjusted to a negative value is used.

If wet etching is used in the surface layer-modifying step of the present embodiment, an acidic solution such as hydrochloric acid, nitric acid, or aqua regia can be used as an etching solution, but it is preferable to use aqua regia that has an excellent capability for removing the metal phase and allows the reinforced layer to be easily formed. Here, when aqua regia is used in the wet etching, it is preferable to set an etching processing time to be longer than 30 seconds to reliably adjust Rsk to a value of −1.0 μm or smaller. The processing time is more preferably 60 seconds or longer, and even more preferably 90 seconds or longer. If dry etching is applied in the surface layer-modifying step, a known method can be applied. In the present embodiment, for example, a mold having a desired reinforced layer can be obtained by making a chamber in which plasma is generated have an Ar atmosphere with a reduced pressure of about 2 Pa, making the Ar gas into a plasma, and performing etching with application of a bias voltage of −300 V to the base material.

In order to further improve abrasion resistance, it is preferable to coat the reinforced layer with a DLC film as a hard film in the production method for the mold of the present invention. Although a known deposition method such as sputtering or a plasma CVD method can be employed for the coating with the DLC film, when a filtered arc ion plating method is used, smoother coating of the DLC film with fewer droplets can be expected. In addition, to form a DLC film having excellent hardness and adhesion to the mold, it tends to be preferable to coat with the DLC film while reducing a flow rate of a nitrogen gas and/or a gas containing hydrogen such as a hydrocarbon introduced into a furnace in the present invention. Here, instead of introducing a hydrogen-containing gas, a gas bombardment process using a mixed gas including hydrogen may be performed to remove an oxide film, dirt, or the like present on the surface of the reinforced layer while causing the surface of the DLC film on the reinforced layer side to contain hydrogen. At this time, the hydrogen-mixed gas is preferably a mixed gas containing argon gas and 4 mass % or more of hydrogen gas with respect to the total mass of the mixed gas.

In the production method of the mold of the present invention, besides the DLC film described above for further improving abrasion resistance, a hard film formed of one or more kinds selected from a carbide, nitride, carbonitride, oxide, and boride of Groups 4, 5, and 6 transition metals, Si, and Al may be coated on the reinforced layer. More preferably, a film made of a Cr-based nitride, Ti-based nitride, or Ti-based carbonitride can be applied, and even more preferably, a film made of TiCN, AlCrN, TiSiN, TiAlN, AlCrSiN, TiAlSiN, or TiAlCrSiN can be applied. Most preferably, a film made of AlCrSiN is applied. In addition, when AlCrSiN is applied in order to improve abrasion resistance, it is preferable to control a composition formula of $Al_xCr_ySi_z$ such that $25<x<75$, $20<y<75$, and $0.0<z<10$ are satisfied. Likewise, when TiAlSiN is applied, it is preferable to control a composition formula of $Ti_xAl_ySi_z$ such that $25<x<75$, $20<y<75$, and $0.0<z<10$ are satisfied. Although a PVD method can be used as the film deposition method, the film is preferably formed using a sputtering method since a smooth film surface with few droplets can then be obtained. When a sputtering method is used, it is preferable to set a bias voltage to be applied to the base material to 40 to 150 V to improve adhesion strength between the base material and the film while further improving surface smoothness. In addition, a CVD method may be used, and a smoother film can be obtained by using a CVD method. For example, when TiCN is coated using a thermal CVD method, it is preferable to set a film thickness to 0.5 to 2.0 µm, and a film formation temperature to 700 to 900° C.

EXAMPLES

Example 1

Figure 7:
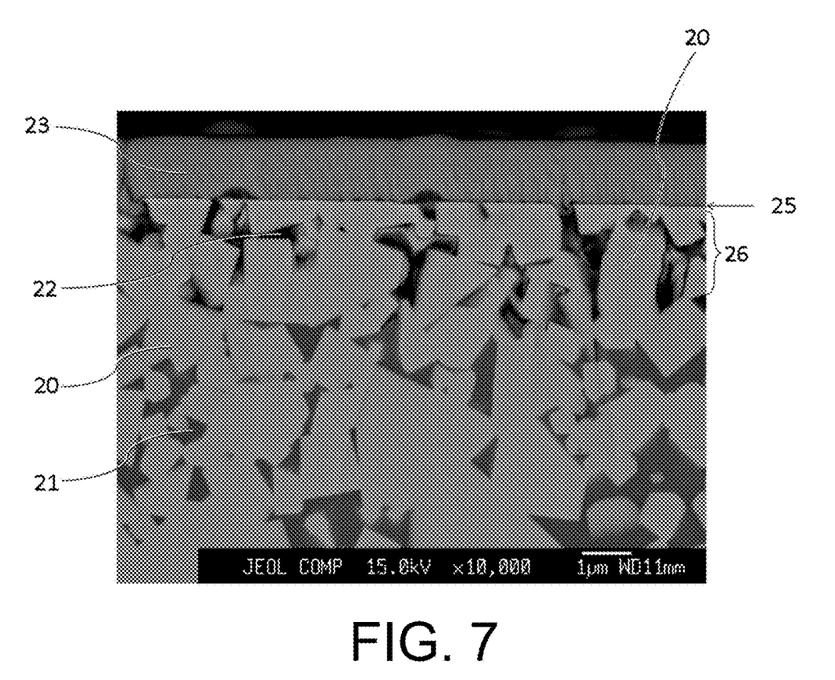
FIG. 7 is a cross-sectional photo showing a mold of the present invention in a vicinity of a working surface.

A mold made of composite material (made of cemented carbide) for which WC was selected in the hard phase and Co was selected in the metal phase was prepared. The volume ratio between hard powder and metal powder of the composite material was 82:18. After the mold was ground using a grinding tool until Ra=1.5 µm was satisfied, the surface of the mold was polished in buffing using a diamond paste until Ra=0.005 µm was satisfied. The sample No. 1 is an example of the reinforced layer of the present invention obtained by immersing the polished surface of the mold in aqua regia for 60 seconds and removing Co (metal phase) therefrom. The sample No. 2 is an example of the reinforced layer of the present invention formed by performing plasma etching on the polished surface of the mold in an Ar atmosphere under a pressure of 2 Pa by applying a bias voltage of −300 V and removing Co (metal phase) therefrom. For the sample No. 11 that is a comparative example, no processing was performed after polishing. A photo showing the vertical cross-section of the manufactured sample No. 1 near the surface is shown in FIG. 7. In FIG. 7, reference numeral 20 denotes a hard phase, reference numeral 21 denotes a metal phase, reference numeral 22 denotes a void, and reference numeral 23 denotes a Ni-plated layer as a protective layer. From FIG. 7, it can be ascertained that the surface layer of the sample No. 1 (the working surface 25 side) had voids 22 due to removing the metal phase 21 therefrom and the reinforced layer made of the hard phase 20 was formed. This reinforced layer was a layer in which substantially no metal phase was present, and a layer having a thickness of at least 1 µm was formed from the surface as a reinforced layer. In addition, in the range of 1 µm, the hard phase ratio of the reinforced layer was almost 100%. Further, the layer 23 is a Ni-plated layer for protection of the surface of the mold in the cross-section observation photograph of FIG. 7. Due to the formed Ni-plated layer, the shape can be kept when, for example, the mold is cut or the like.

(Measurement of Surface Roughness)

Surface roughness was measured for the samples No. 1, No. 2, and No. 11. For the measurement of surface roughness, a stylus-type roughness meter (SURFCOM) produced by Tokyo Seimitsu Co., Ltd. was used. For measurement conditions, the evaluation length was set to 4 mm, the measurement speed was set to 0.3 mm/s, the cutoff value was set to 0.8 mm, and the filter type was set to Gaussian. The measurement results are shown in Table 1. From the results of the measurement, it can be ascertained that the samples No. 1 and No. 2 which are the examples of the present invention had a small difference in Ra, an absolute value being 0.1 µm or smaller, and sufficient smoothness in comparison to the sample No. 11 of which only the surface had been finished to be smooth in the polishing. In addition, it can be ascertained that the samples No. 1 and No. 2 had Rsk of −0.01 or smaller and exhibited fewer sharp protrusions than the sample No. 11. In particular, the sample No. 1 that was processed by wet etching with aqua regia had a large negative value of Rsk which was −1.6. This value shows that sharp protrusions of the roughness curve of the working surface were further reduced, and it can be determined from this fact that the reinforced layer of the present invention was formed to a deep position. The sample No. 11 that is a comparative example that had not undergone the surface layer-modifying process had Rsk>0 and failed in gaining the target surface roughness.

TABLE 1

| Sample No. | Surface roughness | | |
|---|---|---|---|
| | Ra (µm) | Rz (µm) | Rsk |
| 1 | 0.006 | 0.093 | −1.685 |
| 2 | 0.020 | 0.235 | −0.089 |
| 11 | 0.005 | 0.066 | 1.061 |

(Sliding Test)

Figure 5:
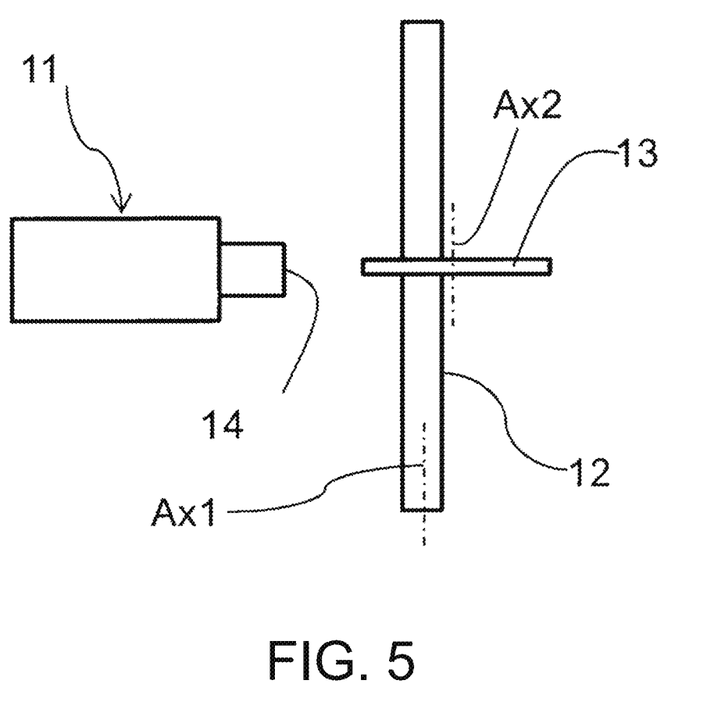
FIG. 5 is a schematic top view of a sliding test device used in Examples.
Figure 6A:
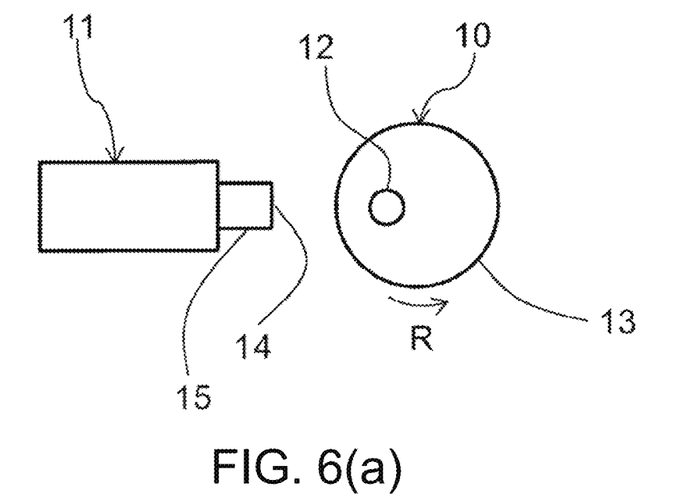
FIG. 6(a) is a schematic side view illustrating when a circular plate part was separated from a sample.
Figure 6B:
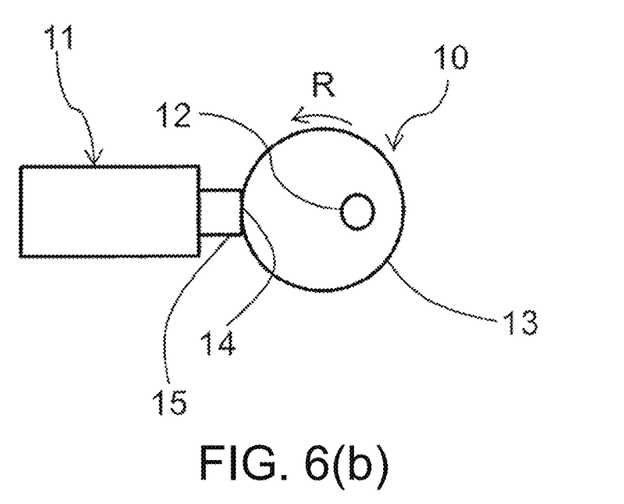
FIG. 6(b) is a schematic side view illustrating when the circular plate part was in contact with the sample.

Next, a test for comparing sliding characteristics of the samples of the examples of the present invention manufactured under the conditions of No. 1 and the sample of the comparative example that did not undergo the processing of the present invention was conducted. The schematic diagrams of the device used for the sliding test are illustrated in FIG. 5 and FIGS. 6(a) and 6(b). FIG. 5 is a top view of the test device, and FIGS. 6(a) and 6(b) are side views of FIG. 5. As illustrated in the diagrams, the test device used in the present embodiment includes a holding mechanism 11 including an arm part 15 mounting and holding a sample at a sample installation part 14, a contact jig 10 repeating bringing into contact with and separating from the sample while rotating, and a rotation mechanism (not illustrated) rotatably holding the contact jig 10. The contact jig 10 is composed of an axis part 12 having a rotation axis Ax1 and a circular plate part 13 having a central axis Ax2 eccentric from the rotation axis Ax1. Further, although it cannot be determined from FIGS. 5 6(a) and 6(b), a storage hole in which the arm part 15 is stored and held to freely advance and retract is formed in the body part of the holding mechanism in which the arm part is installed, an elastic part (e.g., a spring) is installed in the storage hole, and when the sample receives a vertical drag, the sample is pushed back. With the above-described configuration, the test device used in the present embodiment can allow evaluation of abrasion of the mold material in an actual use environment without providing a mold in simulated actual processing states.

Figure 1A:
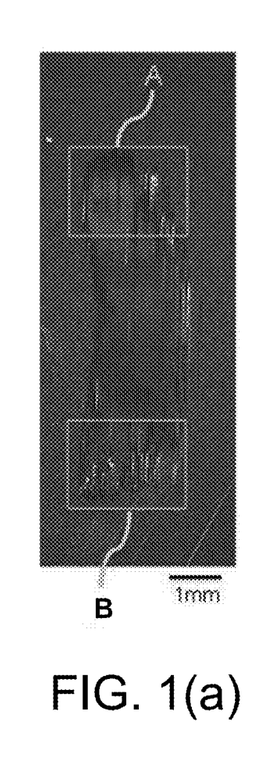
FIG. 1(a) is the appearance of the entire sliding part.
Figure 1B:
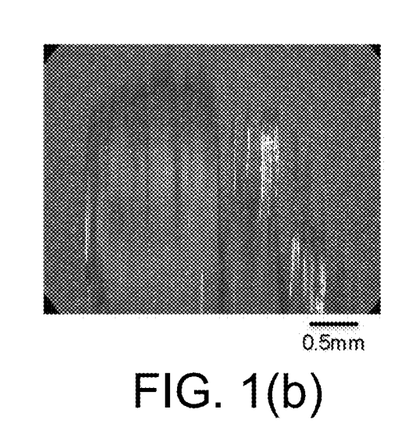
FIG. 1(b) is an enlarged photo of the part A of FIG. 1(a)
Figure 1C:
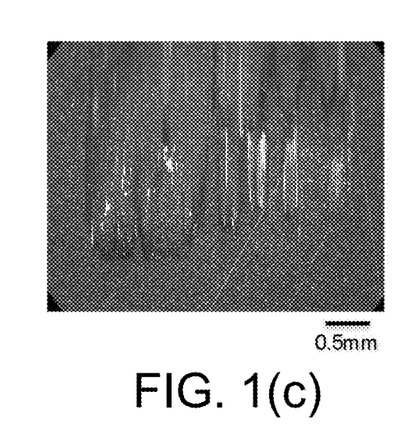
FIG. 1(c) is an enlarged photo of the part B of FIG. 1(a).
Figure 2A:
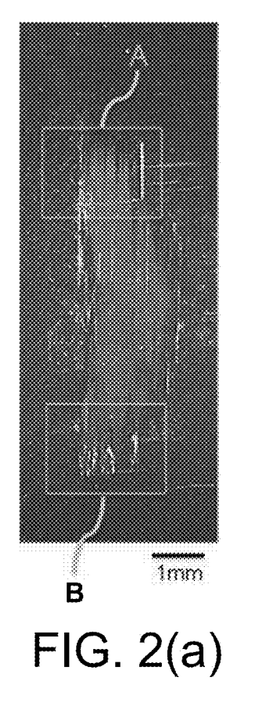
FIG. 2(a) is the appearance of the entire sliding part.
Figure 2B:
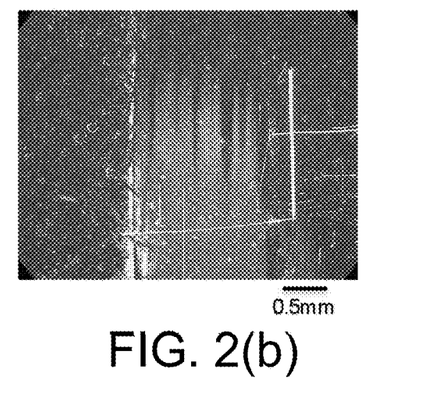
FIG. 2(b) is an enlarged photo of the part A of FIG. 2(a)
Figure 2C:
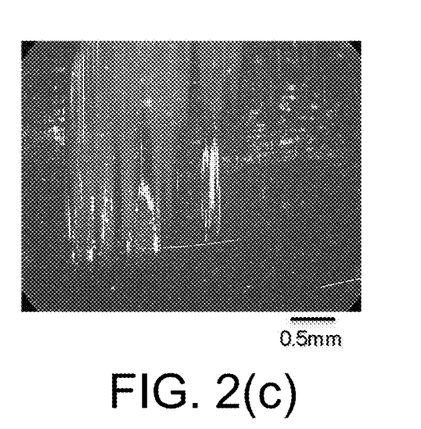
FIG. 2(c) is an enlarged photo of the part B of FIG. 2(a).
Figure 3A:
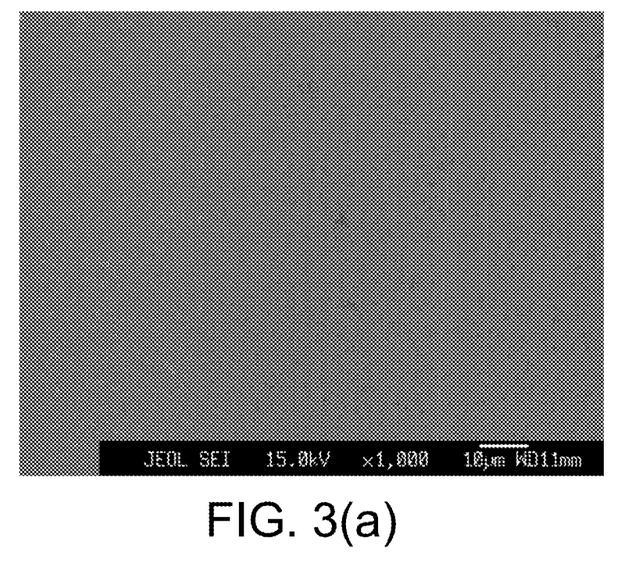
Figure 3B:
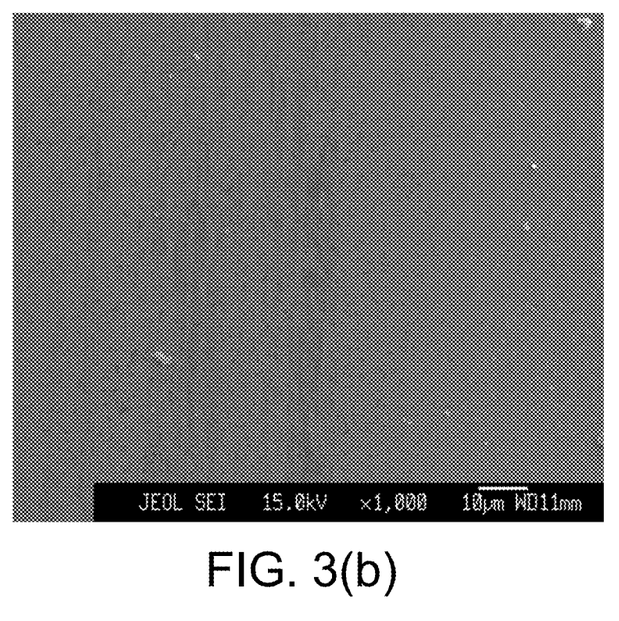
Figure 4A:
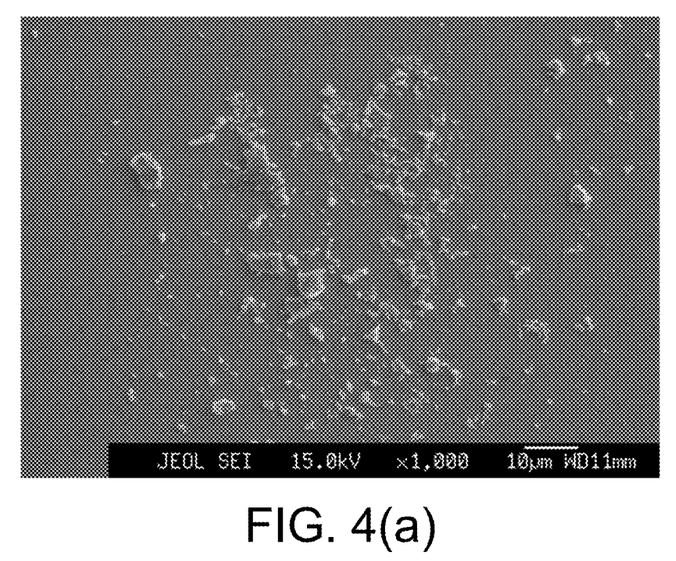
Figure 4B:
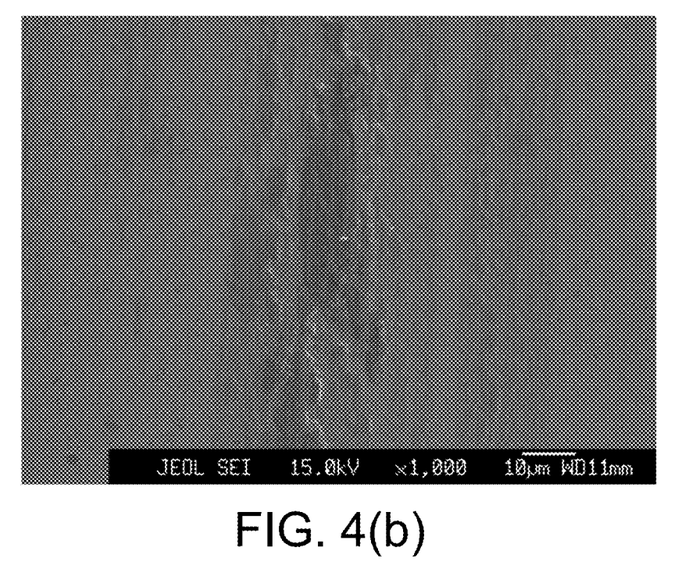

The samples of the example of the present invention and the comparative example were placed at the tip of the above-described arm part 15, the circular plate part (corresponding to a workpiece) made of SCM420 was rotated at a rotation speed of 30 m/min, a vertical drag applied to the samples was set to 120 N, and the samples of the example of the present invention and the comparative example were caused to slide 1,000 times. The appearance of the sliding part of the sample of the example of the present invention after the test is shown in FIG. 1(a) to FIG. 1(c), and the appearance of the sliding part of the sample of the comparative example is shown in FIG. 2(a) to FIG. 2(c). In FIG. 1(a) and FIG. 2(a), it can be ascertained that the adhesion part of the workpiece of the sample of the example of the present invention was smaller than in the sample of the comparative example. Further, enlarged photos of FIG. 1(b) and FIG. 2(b) captured by a scanning electron microscope (SEM) showing the inlet of the circular plate part at which adhesion of the workpiece is likely to easily occur are shown in FIG. 3(a) and FIG. 4(a), and enlarged photos of FIG. 1(c) and FIG. 2(c) captured by the scanning electron microscope (SEM) showing the outlet thereof are shown in FIG. 3(b) and FIG. 4(b). Although material adhering to the workpiece was found in FIGS. 4(a) and 4(b) which are the photos of the comparative example, a material adhering to the workpiece was significantly reduced in FIGS. 3(a) and 3(b) which are the photos of the example of the present invention, and it can be ascertained that the sliding property of the sample of the example of the present invention was significantly improved. In addition, to evaluate the adhesion amount for the example of the present invention and the comparative example, surface analysis was performed using an electron probe micro-analyzer (EPMA; JXA-8500F manufactured by JEOL Ltd.), and the average count value of Fe in a measurement area of 130 μm×280 μm of a mapping result was measured. As a result, while the average count value of the comparative example was 38.17, the average count value of the example of the present invention was 12.84, and thus it is thought that the sample of the example of the present invention had a more reduced adhered amount of Fe than the sample of the comparative example.

Example 2

Next, the result of the coated mold of the present invention was checked. First, as the example of the present invention, a sample No. 3 obtained by coating a sample created under the same conditions as the sample No. 1 of Example 1 with a diamond-like carbon (DLC) film as a hard film was prepared. A filtered arc ion plating device was used as a deposition device, a negative bias voltage to be applied to the base material was set to −2000 V, the gas bombardment process using a mixed gas containing 5 mass % of a hydrogen gas in an argon gas was performed for 90 minutes. The flow rate of the mixed gas was set to 50 sccm to 100 sccm. After the gas bombardment process, nitrogen gas was introduced to a deposition chamber at 10 sccm, a bias voltage of −150 V was applied to the base material, and the temperature of the base material was set to 100° C. or lower. Then, a current of 50 A was input to the graphite target, and it was coated with the DLC film for about 10 minutes. Then, the flow rate of the nitrogen gas was set to 5 sccm, and coating with the DLC film was performed for about 10 minutes. Then, the introduction of the nitrogen gas was stopped, coating with the DLC film was performed for 30 minutes, and thereby the sample No. 3 was obtained. Further, as a comparative example, a sample obtained by coating the comparative example sample No. 11 of Example 1 with the DLC film was created and set as a sample No. 12. Further, the film thickness of the samples No. 3 and No. 12 was 0.5 μm.

Next, a sliding test was performed with respect to the created samples of the example of the present invention and the comparative example under the same test conditions as those of Example 1 using the same abrasion test device as that of Example 1. The adhesion amounts (the average count value of Fe) of the samples that had undergone the sliding test were evaluated using the same EPMA device and method as those of Example 1. The evaluation results of Ra, Rsk, and the adhesion amount are shown in Table 2.

TABLE 2

| Sample No. | Film | Ra (μm) | Rsk | Average count value of Fe | Remarks |
|---|---|---|---|---|---|
| 3 | DLC | 0.009 | −2.54 | 3.51 | Example of present invention |
| 12 | DLC | 0.006 | −0.97 | 4.57 | Comparative example |

Figure 8:
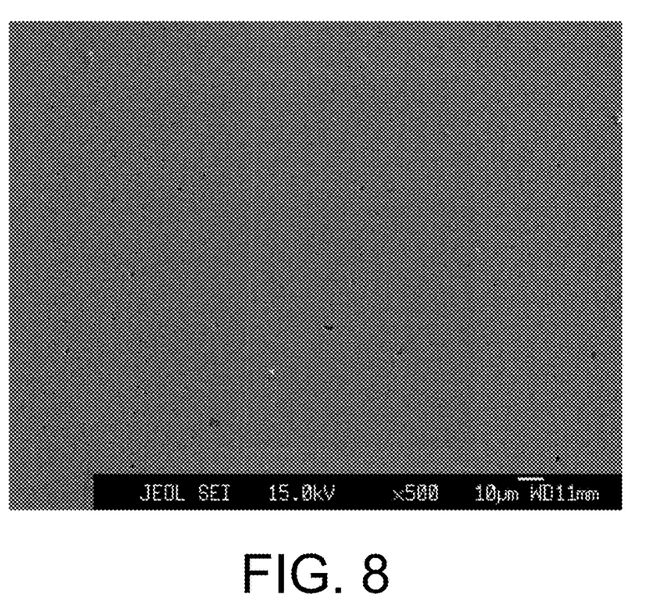
FIG. 8 is an enlarged photo when observing a sliding part of a coated mold of the example of the present invention after the sliding test.
Figure 9:
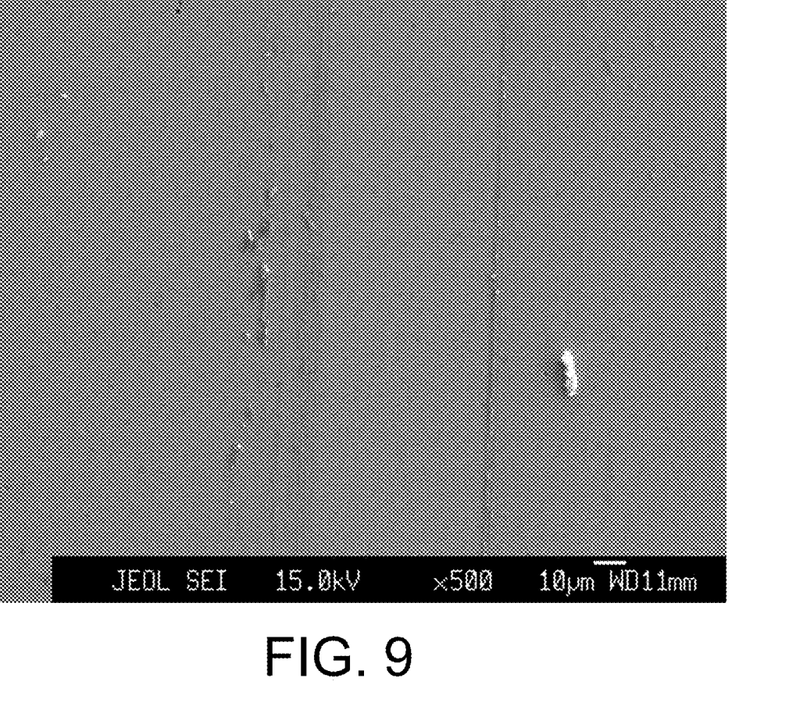
FIG. 9 is an enlarged photo when observing a sliding part of a coated mold of the comparative example after the sliding test.
Figure 10:
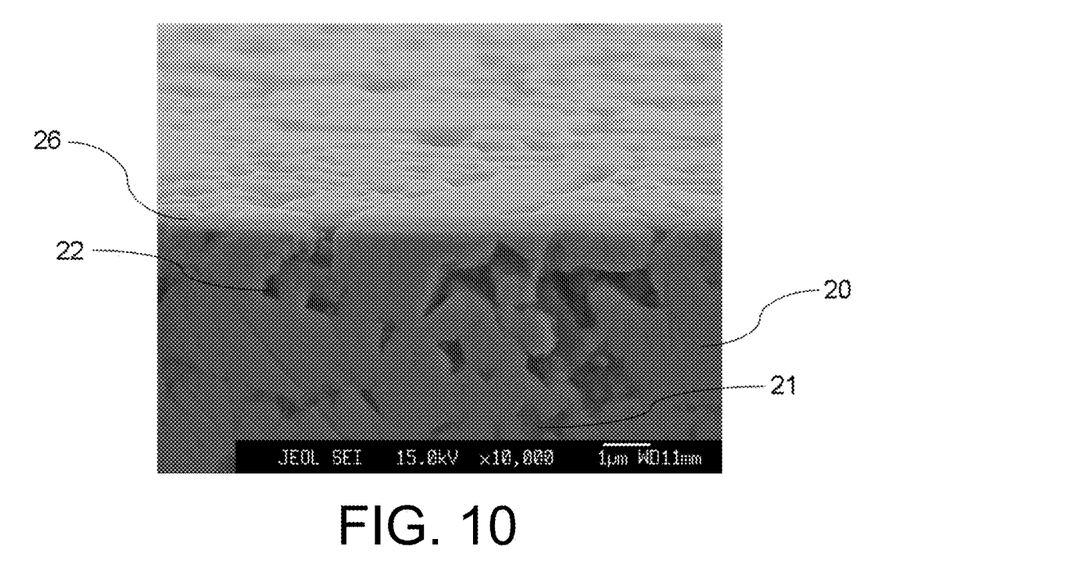
FIG. 10 is a cross-sectional photo showing the coated mold of the example of the present invention in the vicinity of the working surface after the sliding test.
Figure 11:
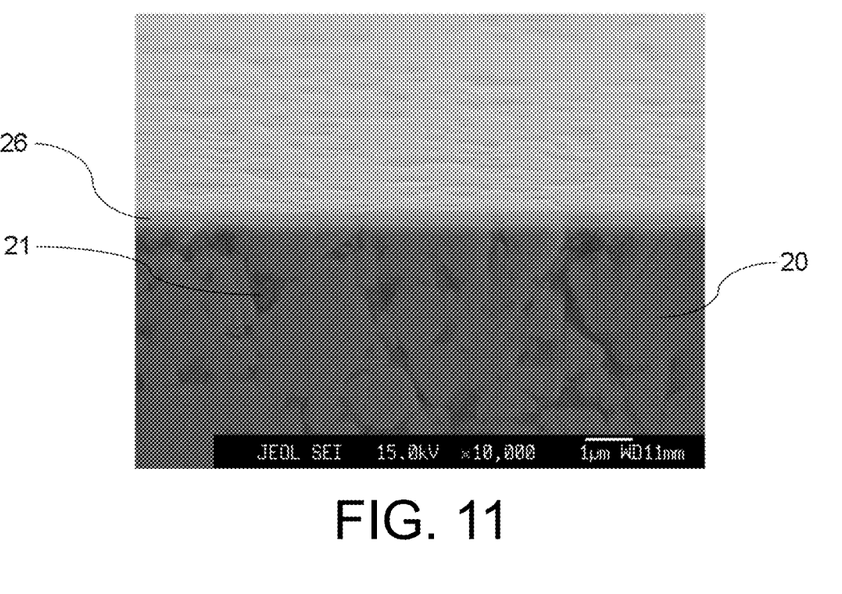
FIG. 11 is a cross-sectional photo showing the coated mold of the comparative example in the vicinity of the working surface after the sliding test.

An enlarged photo of the sliding part of the sample No. 3 after the test captured by the SEM is shown in FIG. 8, and an enlarged photo of the sliding part of the sample No. 12 captured by the SEM is shown in FIG. 9. Although adhering matters to the workpiece are found in FIG. 9 that is of the comparative example, reduced adhering matters to the workpiece are found in FIG. 8 that is of the example of the present invention, and it can be ascertained that the adhering material reducing effect of the example of the present invention was exhibited even after the coating was performed. According to Table 2, although the sample of the comparative example satisfies Ra≤0.1 μm and skewness Rsk≤−0.01 with respect to Ra and Rsk, the adhering material reducing effect of the present invention was not obtained since the bonding layer on the surface of the base material could not be removed, and thus the sample obtained an inferior result to the example of the present invention. An oblique-view photo when observing the surface and the cross-section near the working surface of the sample No. 3 that is of the example of the present invention is shown in FIG. 10, and an oblique-view photo of the sample No. 12 that is of the comparative example is shown in FIG. 11. It can be ascertained in FIG. 10 that the sample No. 3 of the example of the present invention had the transferred uneven shape on the surface of the base material even though the DLC film was coated.

Example 3

Next, the mold was coated with a film formed of a different material from that of Example 2. As an example of the present invention, a sample No. 4 obtained by coating a sample created under the same conditions as those of sample No. 1 of the Example with an AlCrSiN film was prepared. A sputtering device was used as a deposition device, a DC bias voltage of −200 V was applied to the base material, and cleaning was performed thereon using Ar ions. Then, an $N_2$ gas was introduced into the container, sputtering power of 2 kW was supplied to a Ti target by setting the bias voltage to −100 V, then the state was retained for 10 minutes, and a TiN lowermost layer was coated. Then, sputtering power of 4 kW was supplied to an $Al_{65}Cr_{35}$ target (the numerical values are atomic ratios) by setting the bias voltage to −140 V, the state was retained for 15 minutes, and AlCrN layer was coated. Then, sputtering power of 4 kW was supplied to an $Al_{55}Cr_{43}Si_2$ target while power is supplied to the $Al_{65}Cr_{35}$ target, the state was retained for 65 minutes, and an AlCrSiN layer was coated. The total thickness of the films was about 2.7 μm. The result is shown in Table 3.

TABLE 3

| Sample No. | Film | Ra (μm) | Rsk | Average count value of Fe | Remark |
| --- | --- | --- | --- | --- | --- |
| 4 | AlCrSiN | 0.015 | −1.05 | 20.9 | Example of present invention |

Figure 12:
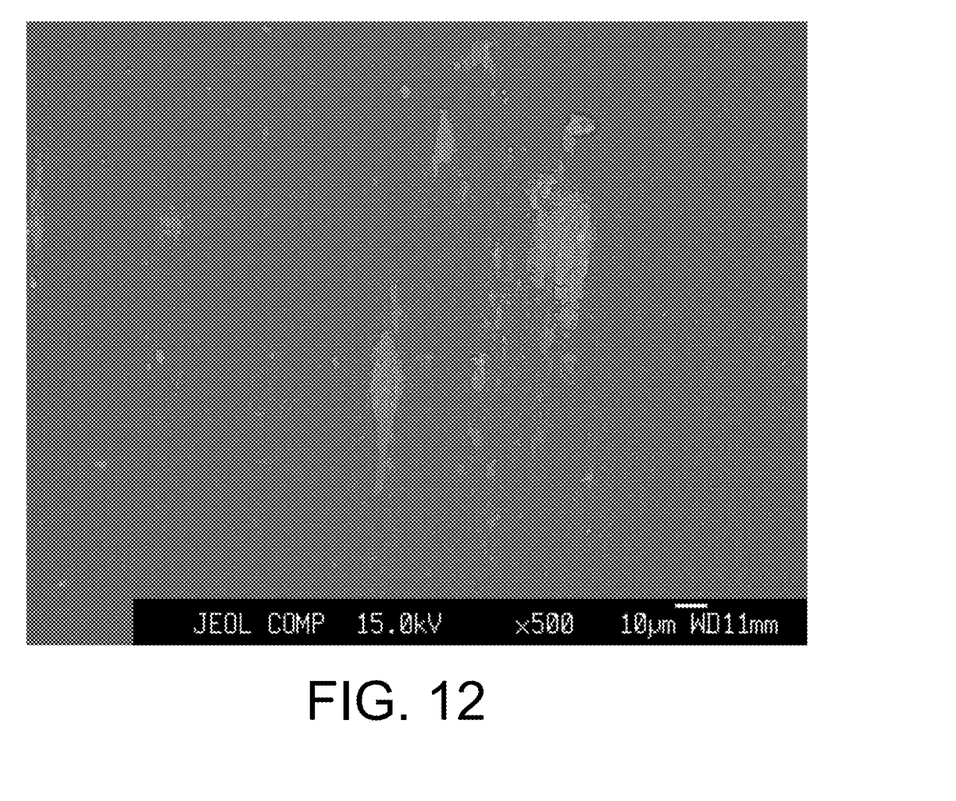
FIG. 12 is a cross-sectional photo showing a coated mold of another example of the present invention in the vicinity of the working surface after the sliding test.

An enlarged photo of the sliding part of the sample No. 4 captured by the SEM is shown in FIG. 12. It is ascertained in Table 3 that the sample No. 4 satisfies Ra≤0.1 μm and skewness Rsk≤−0.01. In addition, the average count value of Fe was lower than the sample No. 11 of Example 1, and it is ascertained that, while the sample No. 4 exhibited the sufficient adhering material reducing effect, it could exhibit high abrasion resistance.

The invention claimed is:

1. A mold made of a composite material comprising a hard phase and a metal phase, wherein:
    the mold has a reinforced layer composed of a hard phase for a working surface and voids in the reinforced layer, wherein the hard phase is formed by removing a metal phase from the working surface to faun the voids in the reinforced layer and so that the reinforced layer is free of the metal phase, and
    the working surface satisfies an arithmetic average roughness of Ra≤0.1 μm and skewness Rsk≤−0.01.

2. The mold according to claim 1, wherein the working surface of the mold satisfies skewness Rsk≤−1.0.

3. The mold according to claim 2, wherein the hard phase is WC, and the metal phase is Co.

4. The mold according to claim 1, wherein the hard phase is WC, and the metal phase is Co.

5. A mold made of a composite material comprising a hard phase and a metal phase, wherein:
    the mold has a reinforced layer composed of a hard phase for a working surface and voids in the reinforced layer, wherein the hard phase is formed by removing a metal phase from the working surface to form the voids in the reinforced layer and so that the reinforced layer is free of the metal phase,
    a hard film is provided on a top surface of the reinforced layer,
    the hard film is one or more kinds selected from at least one kind of carbide, nitride, carbonitride, oxide, and boride of Groups 4, 5, and 6 transition metals, Si, and Al, and diamond-like carbon, and
    wherein a surface of the hard film satisfies an arithmetic average roughness of Ra≤0.1 μm and skewness Rsk≤−1.0.

6. A production method for a mold made of a composite material comprising a hard phase and a metal phase, the method comprising:
    a shaping step for working a surface of the mold made of the composite material and adjusting to Ra≤0.1 μm; and
    a surface layer-modifying step after the shaping step for etching the surface of the mold adjusted to Ra≤0.1 μm and removing the metal phase near the surface to form a reinforced layer composed of the hard phase for a working surface and voids in the reinforced layer, wherein the reinforced layer is free of the metal phase, and the working surface satisfies an arithmetic average roughness of Ra≤0.1 μm and skewness Rsk≤−0.01.

7. The production method for a mold according to claim 6, wherein the surface layer-modifying step is wet etching using an acidic solution.

8. The production method for a mold according to claim 6, comprising:
    a coating step of forming a hard film of one or more kinds selected from at least one kind of carbide, nitride, carbonitride, oxide, and boride, of Groups 4, 5, and 6 transition metals, Si, and Al, and diamond-like carbon on the surface of the mold after the surface layer-modifying step.

9. The production method for a mold according to claim 7, comprising:
    a coating step of forming a hard film of one or more kinds selected from at least one kind of carbide, nitride, carbonitride, oxide, and boride, of Groups 4, 5, and 6 transition metals, Si, and Al, and diamond-like carbon on the surface of the mold after the surface layer-modifying step.

* * * * *